(12) United States Patent　　(10) Patent No.:　　US 6,504,783 B2
Jo　　(45) Date of Patent:　　Jan. 7, 2003

(54) SEMICONDUCTOR DEVICE HAVING EARLY OPERATION HIGH VOLTAGE GENERATOR AND HIGH VOLTAGE SUPPLYING METHOD THEREFOR

(75) Inventor: Seoung-Kue Jo, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/953,202

(22) Filed: Sep. 17, 2001

(65) Prior Publication Data

US 2002/0060943 A1 May 23, 2002

(30) Foreign Application Priority Data

Nov. 23, 2000　(KR) ............................................ 00-69833

(51) Int. Cl.[7] ................................................. G11C 7/00
(52) U.S. Cl. ................... 365/226; 365/230.06; 365/194
(58) Field of Search ........................... 365/226, 230.06, 365/189.09, 189.11, 233, 194

(56) References Cited

U.S. PATENT DOCUMENTS

| | | | | |
|---|---|---|---|---|
| 5,249,155 A | * | 9/1993 | Arimoto et al. | ............ 365/222 |
| 5,610,863 A | | 3/1997 | Yamada | ................. 365/189.09 |
| 5,673,232 A | * | 9/1997 | Furutani | ..................... 365/226 |
| 5,936,911 A | | 8/1999 | Inaba | ......................... 365/233 |
| 6,215,708 B1 | * | 10/2001 | Lien et al. | ............. 365/189.09 |

* cited by examiner

Primary Examiner—Hoai Ho
Assistant Examiner—Gene N. Auduong
(74) Attorney, Agent, or Firm—Lee & Sterba, P.C.

(57) ABSTRACT

A semiconductor device for performing a static random access memory operation includes a plurality of refresh type memory cells provided at intersections of a plurality of word lines and a plurality of bit lines, a high voltage generator providing a voltage higher than a power source voltage to a stand-by high voltage output node in response to a driving control signal activated in a memory cell access operation period, an internal circuit related to word line driving for selecting a word line among the plurality of word lines using the high voltage in response to command information and address information, and a driving control signal generator generating the driving control signal in response to the command information to operate the high voltage generator prior to initial charge consumption in the stand-by high voltage output node during the memory cell access operation period.

21 Claims, 3 Drawing Sheets

SEMICONDUCTOR DEVICE HAVING EARLY OPERATION HIGH VOLTAGE GENERATOR AND HIGH VOLTAGE SUPPLYING METHOD THEREFOR

BACKGROUND OF THE INVENTION

1. Field of the Invention

The present invention relates to semiconductor devices having memory cells that require a periodic refresh operation. More particularly, the present invention relates to a high voltage generator and a high voltage supply method for use in such semiconductor devices, suitable for performing a refresh operation internally, while operating externally under the same timing conditions as static random access memory (SRAM).

2. Description of Related Art

In semiconductor random access memory (RAM) devices, data is stored at a specific location in a memory cell array designated by an individual address. The data is stored in basic RAM cells such as static RAM (SRAM) cells and dynamic RAM (DRAM) cells. The SRAM cell has a static latching structure (typically comprised of six transistors, or four transistors and two resistors) that can store data without a refresh operation as long as an external power supply is maintained. The DRAM cell is comprised of one storage element (typically a capacitor) and one access transistor. In the DRAM cell, high state data is stored in the capacitor, which gradually discharges over time. Therefore, high state data cannot be stored in a DRAM cell for long unless the DRAM cell is periodically refreshed.

The periodic refresh operation required for a DRAM cell to prevent charge leakage and consequential data loss requires a circuit to perform the refresh operation before such a loss of data occurs. An Early DRAM (especially, DRAM operating externally having the same timing conditions as SRAM) can perform a refresh function under the control of an external storage device controller. Currently, most DRAM memory devices possess internal refresh circuitry and can perform an internal refresh function.

A benefit DRAM is that a DRAM cell is smaller than a SRAM cell produced by a similar process, but much more data can be stored in the smaller DRAM cell than in the larger SRAM cell. Therefore, it is desirable to develop DRAM that can replace SRAM without impacting the operating conditions of peripheral circuits.

However, it is important to guarantee effective operation of a DC generator for reliable performance of a semiconductor device. Thus, many attempts at stable operation of a DC generator have been made. A method for controlling a booster circuit for providing a high voltage VPP higher than an external power supply voltage to internal circuits needing the high voltage VPP such as word line drivers in a memory device having DRAM memory cells is disclosed in U.S. Pat. No. 5,610,863, issued on Mar. 11, 1997, to Yamada. In FIG. 2 of the patent, a booster circuit generates a voltage VPP using an oscillator and a boosting capacitor to charge a bias capacitor via a transistor to a voltage that is higher than an input power supply voltage. A word line driver switches VPP to a particular word line in response to a selection signal provided during an "active" period of memory operation. The particular word line selection provides a refresh charge to a memory cell. Since a typical boosting operation of the booster circuit is longer than the active period, it is possible to provide a voltage required for a read operation to the word line in a short cycle period, thereby improving the reliability of the memory device.

The patent, however, does not provide a solution for a voltage level drop problem that occurs during VPP charge supply in an initial active period. The voltage level drop problem that occurs during initial VPP charge consumption will be clarified in the following explanation.

Word line, or W/L, enable time for memory cell access of conventional DRAM is determined on the basis of a randomly applied external timing signal via a particular W/L path, and a W/L path is enabled through the shortest path from the external timing to minimize the access time. In this case, the enabling time for the VPP supply is determined on the basis of the W/L enabling time to minimize charge consumption due to leakage. Since the VPP generator generates charge by a boosting method using a pumping capacitor, a pre-charge time of a boosting node can be lengthy. Because the starting time of the charge supply for the boosting operation is based on the W/L enable time, under the condition that the stand-by VPP level is maintained in stand-by operation mode, the starting time to supply charge in the VPP generator is delayed compared with the initial starting time to consume the VPP charge. Therefore, in a 3.3 volt synchronous dynamic random access memory (SDRAM) case, there is a voltage drop of about 0.5~0.7 volt from a reference VPP at initial VPP charge consumption. This voltage drop results in a time delay in a circuit chain using the VPP, and, in the worst case, failure of memory cell operation. In FIG. 3, the VPP drop is shown graphically when the VPP generator is enabled (refer to VPP_EN) based on W/L enable time (refer to W/L). In FIG. 3, time points t1 and t2 indicate initial charge consumption time of the VPP charge, and initial VPP charge supply time, respectively. According to this operation timing, a voltage level drop indicated by G1 occurs, and can result in performance deterioration of a semiconductor device due to failure of memory cell operation.

Thus, there is a demonstrated need to prevent the above-described voltage drop during a DRAM refresh operation to ensure reliability of the memory device.

SUMMARY OF THE INVENTION

It is therefore a feature of an embodiment of the present invention to provide an improved semiconductor device adapted VPP generator and an operation method thereof.

It is another feature of an embodiment of the present invention to provide an operation control method to prevent a VPP level drop by effectively controlling the VPP generator.

It is another feature of an embodiment of the present invention to provide a semiconductor device that can reduce or minimize a voltage drop at VPP charge consumption, and a VPP supplying method therefore.

According to a preferred embodiment of the present invention, there is provided a semiconductor memory device, preferably for performing a static random access memory operation, including an internal power supply voltage generator selectively providing an internal voltage that is higher than an external power supply voltage, and including a word line driving circuit coupled to the internal voltage, wherein a starting point of time of a charge supply operation of the high voltage generator occurs prior to a starting point of time of charge consumption of the high voltage in the word line driving circuit.

According to another embodiment of the present invention, there is provided a semiconductor device which includes an internal power supply voltage generator for generating an internal power supply voltage coupled to an external power supply voltage, an internal circuit coupled to the internal power supply voltage, and a driving control signal generator for applying a driving control signal to the internal power supply voltage generator wherein a starting point of time for charge supply of the internal power supply voltage generator is earlier than a starting point of time of charge consumption of the internal power supply voltage in the internal circuit. The voltage level of the internal power supply voltage in the internal power supply voltage generator is preferably higher than that of the external power supply voltage. The VPP is preferably supplied to a stand-by VPP output node in response to a driving control signal activated in a memory cell access operation period. A DRAM cell may be coupled to the internal circuit, and the semiconductor memory device preferably performs a static random access memory operating interface.

According to another embodiment of the present invention, a semiconductor memory device performing a static random access memory interface provides a plurality of refresh type memory cells provided in intersections of a plurality of word lines and a plurality of bit lines, a high voltage generator for providing a high voltage to a stand-by high voltage output node in response to a driving control signal activated in a memory cell access operation period, wherein the high voltage is higher than a power source voltage, an internal circuit related to word line driving for selecting a word line among the plurality of word lines using the high voltage in response to command information and address information, and a driving control signal generator generating the driving control signal in response to the command information, wherein a starting point of time for driving the high voltage generator is earlier than a starting point of time of charge consumption at the stand by high voltage output node in the memory cell access operation period. The starting point of time of charge consumption preferably corresponds to the enabling point of time of the selected word line.

According to another embodiment of the present invention, a method for controlling a high voltage generator of a semiconductor memory device having a plurality of refresh type memory cells connected to intersections of a plurality of word lines and a plurality of bit lines, and performing a static random access memory operating interface is provided, wherein the method includes receiving external command information applied in a memory cell access operation period and providing a driving control signal to the high voltage generator based on the external command information, wherein a starting point of time of a charge supply operation of the high voltage generator occurs prior to a starting point of time of charge consumption at an output node of the high voltage generator. The command information preferably relates to read, write and refresh signals.

According to another embodiment of the present invention, a method for controlling a high voltage generator of a semiconductor memory device having a plurality of refresh type memory cells connected to intersections of a plurality of word lines and a plurality of bit lines, and performing a static random access memory operating interface, comprising generating a command output signal in response to an external command signal applied in a memory cell access operation period is provided, wherein the method includes supplying a high voltage to an internal circuit by enabling the high voltage generator during generation of the command output signal, and delaying the command output signal and providing the delayed command output signal to the internal circuit for selecting a word line among the plurality of word lines, wherein the selected word line is activated at a point of time that is delayed compared with a supply point of time of the high voltage. The command output signal may preferably be applied to an address selection decoder, the address selection decoder generating a first address decoding signal. The internal circuit may include a word line enable circuit, a word line driver controller, and a word line. The charge consumption operation preferably occurs in the internal circuit after the high voltage is supplied, and may occur before enabling of the selected word line.

According to the present invention, reliability of a memory cell access operation may be greatly improved and layout size may be reduced, due to minimization of the voltage drop that occurs at consumption of the VPP charge, which allows a reduction in the size of a pumping capacitor in the VPP generator.

These and other features and aspects of the present invention will be readily apparent to those of ordinary skill in the art upon review of the detailed description that follows.

BRIEF DESCRIPTION OF THE DRAWINGS

The present invention, as well as preferred modes of use, further features, and advantages thereof, will be best understood by reference to the following detailed description of illustrative embodiments when read in conjunction with the accompanying drawings, wherein.

DETAILED DESCRIPTION OF THE PREFERRED EMBODIMENT

Korean Patent Application No. 2000-69833, filed on Nov. 23, 2000, and entitled: "Semiconductor Device Having Early Operation High Voltage Generator and High Voltage Supplying Method Therefore" is incorporated herein by reference in its entirety.

Hereinafter, a preferred embodiment of the present invention will be described in detail with reference to the accompanying drawings.

Figure 1:
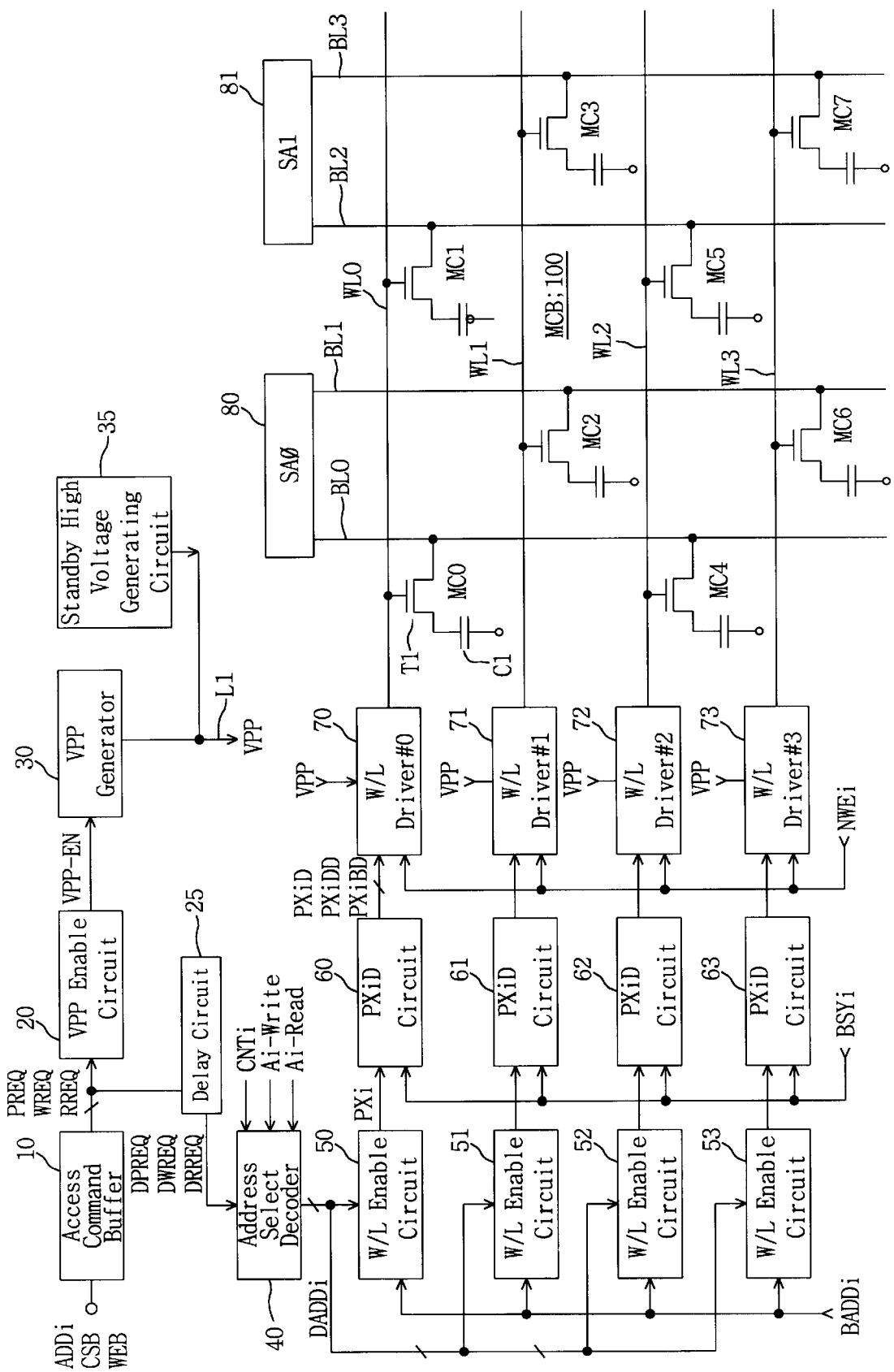
FIG. 1 illustrates a block diagram of an embodiment of a VPP generator and circuitry related to word line driving according to the present invention.
Figure 2:
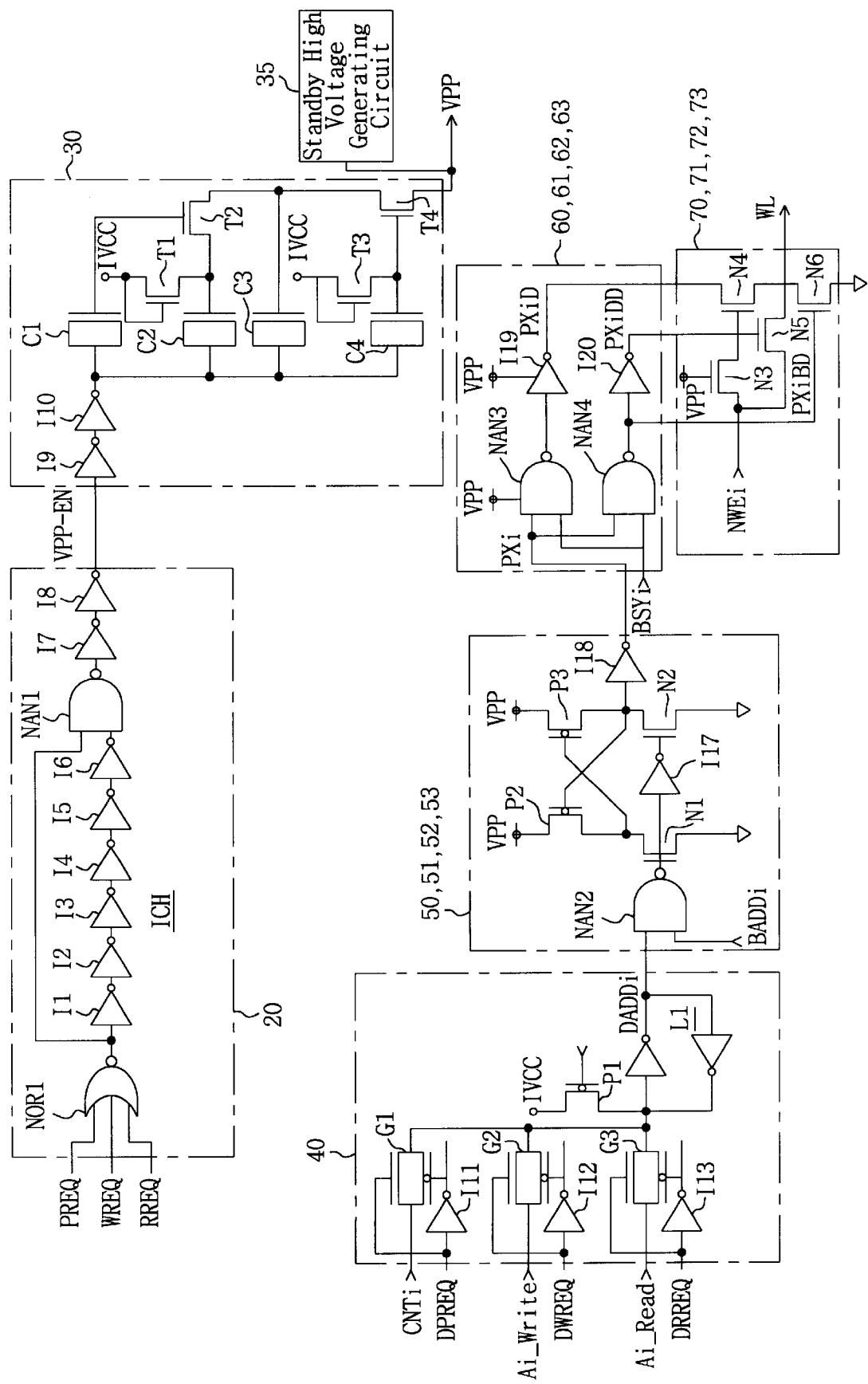
FIG. 2 illustrates a circuit diagram of detailed circuitry according to FIG. 4

In FIG. 1, a block diagram of VPP generator and circuits related to W/L driving according to the present invention are illustrated. FIG. 2 illustrates detailed circuitry of the blocks in FIG. 4.

Referring first to FIG. 1, refresh type memory cells (MC0, MC1, MC2, MC3, . . . , MC7) in memory cell array (100) are connected to intersections of W/Ls (WL0, WL1, WL2, WL3) and bit lines (BLi, i=0–3) that comprise a matrix of a plurality of rows and columns. Block sense amplifiers (80, 81) are preferably connected to corresponding bit lines.

A VPP generator provides VPP higher than power source voltage (IVCC) (block 40 of FIG. 2) to a stand-by VPP output node (L1) in response to a driving control signal (VPP_EN) activated during a memory cell access operation period. The details of the VPP generator (30) are shown in block (30) of FIG. 2, and preferably include inverters (I9, 110), pumping capacitors (C1, C2, C3, C4), and driving transistors (T1, T2, T3, T4).

A VPP enable circuit (20) as a driving control signal generator generates the driving control signal (VPP_EN) in response to a command information signal (PREQ, WREQ, RREQ) applied to operate the VPP generator (30) prior to charge consumption at the stand-by VPP output node (L1) during the memory cell access operation period. The command information signals are preferably related to read, write, and refresh command signals. The details of the VPP enable circuit (20) shown as block (20) of FIG. 2 preferably include a NOR gate (NOR1) receiving signals related to read, write, and refresh commands (PREQ, WREQ, RREQ), an inverter chain (ICH) including inverters (I1–I6) for delaying the output of the NOR gate (NOR1), a NAND gate (NAN1) for receiving the outputs of the inverter chain (ICH) and the NOR gate (NOR1), a first inverter (I7) for inverting the output of the NAND gate (NAN1), and a second inverter (I8) for inverting the output of the first inverter (I7).

A stand-by VPP generating circuit (35) generates a predetermined VPP level during a stand-by operation mode during which the memory device is not performing an access operation. To minimize power consumption, the driving capability of the stand-by VPP generating circuit (35) is relatively low compared with that of the VPP generator (30), and therefore, stand-by VPP voltage level is low compared with a VPP level of the VPP generator. Detailed operational explanation of the stand-by VPP generating circuit (35) is well known to those of ordinary skill in the art, and is omitted herein for simplicity.

In a preferred embodiment of the present invention, an access command buffer (10) buffers and generates signals related to read, write, and refresh commands (PREQ, WREQ, RREQ) in response to signals applied through external input terminals. The signals related to read, write, and refresh commands (PREQ, WREQ, RREQ) are applied to the VPP enable circuit (20) directly, and are also delayed through a delay circuit (25). The delayed signals (DPREQ, DWREQ, DRREQ) are applied to an address selection decoder (40). The delay circuit (25) is comprised of conventional delay elements. The read and write operations in a semiconductor device may be initiated by a transition of an externally applied address signal, i.e., ADDi, a chip enable signal, i.e., CSB, and a write enable signal, i.e., WEB.

Preferably, the address selection decoder (40) receives respective addresses according to refresh, write, and read operation modes, and generates a first address decoding signal (DADDi) in response to a signal (DPREQ, DWREQ, DRREQ) applied as a control signal and an address (CNTi, Ai-Write, Ai-Read) provided in refresh, write, and read operation modes. The address selection decoder (40) shown as block (40) in FIG. 2 preferably includes inverters (I11, I12, I13) for signal inverting, transmission gates (G1, G2, G3), a clamp transistor for initializing (P1), and an inverter latch (L1). In read operation mode, the signal related to the read command (DRREQ) is applied as a high level. Thus, the transmission gate (G3) is turned-on, and read address (Ai-Read) is provided to the latch (L1) input. The output of the latch (L1) is initially a low level due to initialization of the transistor (P1), and then the latch (L1) inverts the read address (Ai-Read) as the first address decoding signal (DADDi) for the read operation.

Preferably, W/L enable circuit (50) coupled to VPP as a power supply voltage, as shown in FIG. 2, generates a third address decoding signal, i.e., a row address decoding signal (PXi) at VPP level, in response to the first address decoding signal (DADDi) and a second address decoding signal, i.e., a row block address signal (BADDi). The W/L enable circuit (50) shown as block (50) in FIG. 2 preferably includes a NAND gate (NAN2), inverters (I17, I18), cross coupled p-channel MOS transistors (P2, P3), and n-channel MOS transistors (N1, N2). The remaining W/L enable circuits (51, 52, 53) are the same configuration as the W/L enable circuit (50), and have different inputs according to the first address decoding signal (DADDi).

PXiD circuits (60, 61, 62, 63), i.e., W/L driver controllers, generate output signals (PXiD, PXIDD, PXiBD) in response to the row address decoding signal (PXi, i=0~3) and a fourth address decoding signal, i.e., a block control signal (BSYi, i=1~m), to enable W/L in the selected column cell array block by a column address decoding signal (BSY). The output signals (PXiD, PXiDD, PXiBD) are applied to W/L drivers (70, 71, 72, 73). One of the PXiD circuits shown as block (60) in FIG. 2 is coupled to VPP as a power source, and preferably includes a first NAND gate (NAN3) and a second NAND gate (NAN4) receiving the row address decoding signal (PXi) and the block control signal (BSYi), a first inverter (I19) generating a first W/L driving control signal (PXiD) for inverting the output of the first NAND gate (NAN3) and controlling the W/L driver, and a second inverter (I20) generating a second W/L driving control signal (PXiDD) for inverting the output signal (PXiBD) of the second NAND gate (NAN4) and controlling the W/L driver. Herein, the voltage level of the block control signal (BSYi) to activate the PXiD circuits may be VPP level to prevent current leakage.

W/L drivers (70, 71, 72, 73) coupled to VPP for driving corresponding W/Ls (WL0, WL1, WL2, WL3) are preferably comprised of transistors (N3, N4, N5, N6) (FIG. 2). An input signal applied to a drain of transistor (N3) (FIG. 2) is preferably a fifth address decoding signal, i.e., a normal W/L enable signal (NWEi) (FIGS. 1 and 2) provided from a row decoder that is not shown.

The DRAM cell array arrangement according to the present invention in a semiconductor device performing a static random access memory operating interface preferably shares W/L drivers with two adjacent memory cell array blocks to reduce layout area.

It may be understood from FIG. 2 that VPP is applied to the W/L enable circuits (50, 51, 52, 53), the PXiD circuits (60, 61, 62, 63), and the W/L drivers (70, 71, 72, 73). The VPP charge consumption in DRAM is mainly related to W/L enable, block isolation, and block pre-charge operation. In the present invention, it may be possible to reduce or minimize a voltage drop in actual VPP charge consumption by operating the VPP generator (30) prior to initial VPP charge consumption. Therefore, the reliability of memory cell access operations may be improved, and the pumping capacitor size of the VPP generator (30) may be reduced.

In a semiconductor memory device performing as SRAM using DRAM cells, actual W/L activation by an external signal may be delayed from the time that the external signal is applied. The present invention utilizes this point by operating the VPP generator prior to charge consumption, thereby allowing the pumping capacitor of the VPP generator to become charged prior to the VPP charge actually being consumed during W/L activation by supplying charge to the VPP generator in advance of W/L activation. It is thereby possible to reduce the voltage drop in actual VPP charge consumption.

Figure 3:
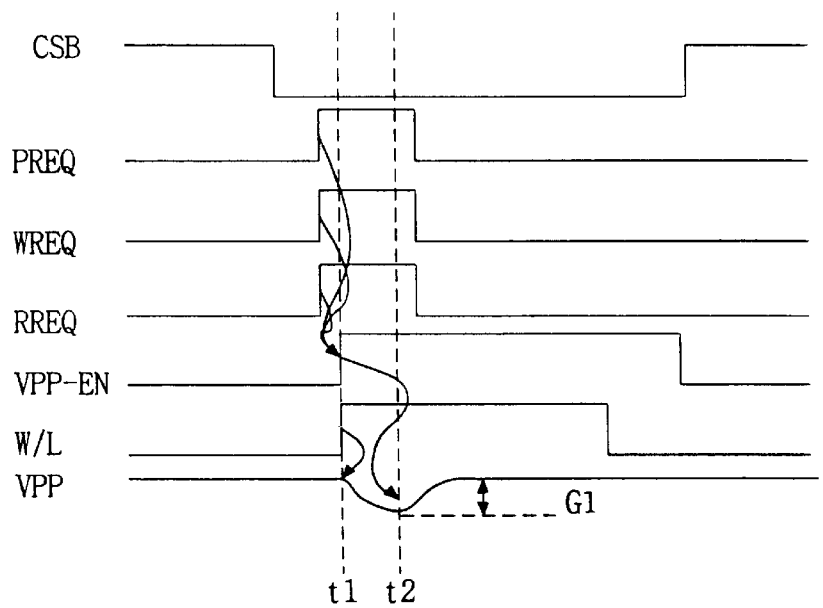
FIG. 3 illustrates a timing diagram of VPP supply operation according to a conventional semiconductor device.

In FIG. 3, illustrating an operation timing diagram of a VPP generator and W/L activation control according to a conventional method, the VPP generator (30) is enabled by signal (VPP EN), activated by a command signal (PREQ, WREQ, RREQ) and activated in accordance with W/L activation while chip selection signal (CSB) is active at a low level. When driving the VPP generator (30) by the conventional method, initial VPP charge consumption occurs prior to VPP charge being supplied at the location where VPP charge consumption takes place. The delay in charge supply to the charge consumption location occurs because the starting time to supply the VPP charge is determined through the shortest path with margin for pumping operation guaranteed, and then the VPP charge is transferred to the local area that actually consumes the VPP charge through a VPP power line, which takes a finite amount of time. The initial VPP charge consumption occurs at time point (t1), and the actual VPP charge supply occurs at time point (t2). In the long run, according to this operation timing, a voltage level drop indicated by G1 occurs, which may result in failure of memory cell operation due to an insufficient voltage level of activated W/L.

Figure 4:
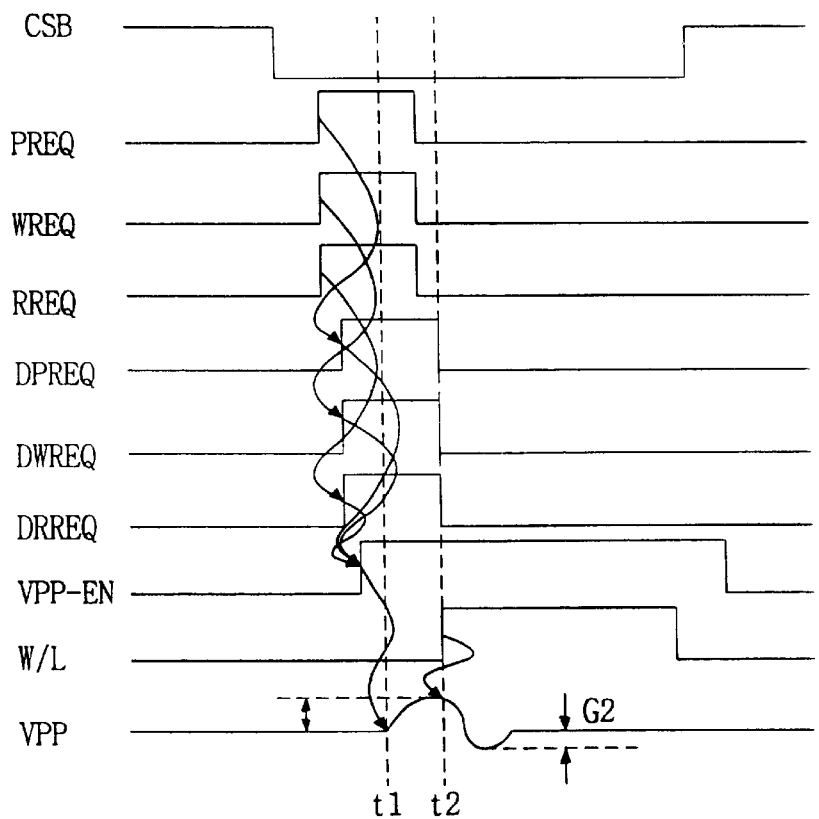
FIG. 4 illustrates a timing diagram of VPP supply operation according to the present invention.

Therefore, VPP charge according to the present invention is supplied by operation timing as shown in FIG. 4. FIG. 4 illustrates a timing diagram of VPP generator (30) and W/L active control, and shows reduction of a VPP level drop when the VPP generator (30) is enabled by the signal (VPP EN) prior to W/L activation. Time point (t1) indicates an initial VPP charge supply time, and time point (t2) indicates an initial VPP charge consumption time. The time point (t1) of FIG. 4 corresponds to the time point (t2) of FIG. 3. According to the timing diagram of FIG. 4, the VPP level drop that occurs is indicated by G2, which is significantly smaller than G1, and failure of memory cell operation may be prevented or minimized.

Particularly, timing as illustrated in the timing diagram of FIG. 4 is very useful in a semiconductor memory device having DRAM cells and SRAM interface operation, as in the present invention. Since this memory device should prevent loss of cell data regardless of an external command, an internal refresh operation should be performed.

In an embodiment of the present invention, an initial predetermined time interval in a read or write operation is necessary to guarantee a refresh operation according to an internal refresh period. Therefore, W/L activation for actual cell operation in response to the externally applied signal for memory cell operation is not through the shortest path, but through a delayed path. Since the starting time for VPP generator (30) operation may be determined on the basis of the time that the external signal for cell operation is applied, it is possible to operate the VPP generator (30) prior to the actual W/L activation time for actual cell operation. By activating the VPP generator (30) prior to W/L activation, sufficient VPP charge may be supplied in advance, and a VPP voltage drop at W/L activation may be reduced or minimized.

Additionally, since sufficient VPP charge is supplied in advance, the capacitor size for pumping, and therefore layout area, may be reduced.

Hereinafter, a read operation, as performed in a memory cell operation of the VPP generator and circuits related to W/L driving of FIG. 1, and the corresponding timing diagram of FIG. 4, will be explained. In read operation mode, an address signal ADDi, a chip enable signal CSB, and a write enable signal WEB are provided to an access command buffer (10). The access command buffer (10) generates signals related to read, write, and refresh commands (PREQ, WREQ, RREQ), which are applied to a VPP enable circuit (20) and a delay circuit (25). The VPP enable circuit (20) generates a driving control signal (VPP_EN); a VPP generator (30) receiving the driving control signal (VPP_EN) provides a VPP higher than a power source voltage (IVCC) (FIG. 2) to a stand-by VPP output node (L1). Also, the delay circuit (25) applies delayed signals related to read, write, and refresh commands (DPREQ, DWREQ, DRREQ) to an address selection decoder (40). Since VPP charge is not yet consumed in W/L enable circuits (50, 51, 52, 53), PXiD circuits (60, 61, 62, 63), and W/L drivers (70, 71, 72, 73), the voltage level of the stand-by VPP output node (L1) becomes higher than a stand-by VPP level as indicated by VPP level difference x in FIG. 4. Therefore, a VPP level higher than the stand-by VPP level is supplied prior to W/L activation. This operation continues to time point t2, when charge consumption commences. Similarly, if a predetermined time delayed signal related to the read command (DRREQ) is applied to the address selection decoder (40), W/L is selected by address decoding signals under the condition that bit line (BLi) is pre-charged. When W/L is activated by address decoding signals, each access transistor connected to the selected W/L is turned-on. At this time, i.e., time point t2 of FIG. 4, VPP charge consumption initially occurs. Here, since a VPP level higher than the stand-by VPP level is applied as a driving voltage, a voltage level drop after the initial charge consumption time point t2 occurs as indicated by G2 in FIG. 4, and is smaller than the voltage level drop indicated by G1 of the timing diagram of a conventional semiconductor device in FIG. 3. Consequently, in the present invention, W/L activation at an insufficient voltage level may be prevented.

After the access transistors are turned-on, storage nodes of memory cells and specific bit lines (BLi) connected to the memory cells may share charge. After charge sharing in bit lines (BLi) commences, sense amplifiers (80,81) are operated by an applied pulse. Thereafter, the sense amplifiers (80,81) amplify corresponding bit line (BLi) voltages, and store amplified data in latches as memory cell data. The stored data in the latches are transferred to I/O lines by the enabling of column selection line signal (CSL) responding to a column decoding signal. The stored data that is not transferred to an I/O line due to non enabling of the corresponding CSL are rewritten to corresponding memory cells during W/L activation. In other words, a refresh operation called active restore is performed.

As described above, according to the semiconductor memory device of an embodiment of the present invention, operating the VPP generator prior to VPP charge consumption and thereby reducing a voltage drop in actual VPP charge consumption may improve the reliability of memory cell access operation. Also, layout area may be reduced by effectively optimizing the pumping capacitor size of the VPP generator.

A preferred embodiment of the present invention has been disclosed herein and, although specific terms are employed, they are used and are to be interpreted in a generic and descriptive sense only and not for the purpose of limitation. Accordingly, it will be understood by those of ordinary skill in the art that various changes in form and scope may be made without departing from the spirit and scope of the invention as set forth in the following claims.

What is claimed is:

1. A semiconductor memory device for performing a static random access memory operation interface comprising:

a plurality of refresh type memory cells provided in intersections of a plurality of word lines and a plurality of bit lines;

a high voltage generator for providing a high voltage to a stand-by high voltage output node in response to a driving control signal activated in a memory cell access operation period, wherein the high voltage is higher than a power source voltage;

an internal circuit related to word line driving for selecting a word line among the plurality of word lines using the high voltage in response to command information and address information; and a driving control signal generator generating the driving control signal in response to the command information, wherein a starting point of time for driving the high voltage generator is earlier than a starting point of time of charge consumption at the stand-by high voltage output node in the memory cell access operation period.

2. The semiconductor memory device according to claim 1, wherein the starting point of time of charge consumption corresponds to an enabling point of time of the selected word line.

3. The semiconductor memory device according to claim 1, wherein the command information is related to read, write, and refresh command signals.

4. The semiconductor memory device according to claim 1, wherein the internal circuit activates the selected word line at a delayed point of time compared with the starting point of time for driving the high voltage generator.

5. A dynamic random access semiconductor memory device for performing a static random access memory operation interface, comprising:

an internal power supply voltage generator generating an internal power supply voltage coupled to an external power supply voltage;

an internal circuit coupled to the internal power supply voltage; and a driving control signal generator for applying a driving control signal to the internal power supply voltage generator, wherein a starting point of time for charge supply of the internal power supply voltage generator is earlier than a starting point of time of charge consumption of the internal power supply voltage in the internal circuit.

6. The semiconductor memory device according to claim 5, wherein the voltage level of the internal power supply voltage in the internal power supply voltage generator is higher than that of the external power supply voltage.

7. The semiconductor memory device according to claim 6, wherein the internal power supply voltage generator includes a plurality of pumping capacitors for boosting the external power supply voltage.

8. The semiconductor memory device according to claim 5, further comprising a stand-by high voltage generator connected to an output node of the internal power supply voltage generator.

9. A method for controlling a high voltage generator of a semiconductor memory device having a plurality of refresh type memory cells connected to intersections of a plurality of word lines and a plurality of bit lines, and performing a static random access memory operating interface, comprising:

receiving external command information applied in a memory cell access operation period; and providing a driving control signal to the high voltage generator based on the external command information, wherein a starting point of time of a charge supply operation of the high voltage generator occurs prior to a starting point of time of charge consumption at an output node of the high voltage generator.

10. The method according to claim 9, wherein the external command information is related to read, write, and refresh command signals.

11. A semiconductor memory device for performing static random access memory operation comprising:

an internal power supply voltage generator selectively providing an internal voltage that is higher than an external power supply voltage; and a word line driving circuit coupled to the internal voltage, wherein a starting point of time of a charge supply operation of the high voltage generator occurs prior to a starting point of time of charge consumption of the high voltage in the word line driving circuit.

12. A semiconductor memory device for performing static random access memory operation comprising:

a plurality of refresh type memory cells connected between a plurality of word lines and a plurality of bit lines;

an access command buffer generating output signals related to read, write, and refresh commands in response to external signals including address signal, chip enable signal, and write enable signal;

a high voltage enable circuit generating a driving control signal in response to at least one of the output signals;

a high voltage generator generating a high voltage in response to the driving control signal; and an internal circuit related to word line driving for selecting a word line among the plurality of word lines, and driving the selected word line to the high voltage at a point of time that is delayed compared with a point of time that the high voltage is generated in the high voltage generator.

13. The semiconductor memory device according to claim 12, wherein the internal circuit related to word line driving comprises:

a delay circuit generating delayed signals in response to the output signals of the access command buffer;

an address selection decoder generating a first address decoding signal in response to the delayed signals;

a word line enable circuit generating a third address decoding signal in response to the first address decoding signal and a second address decoding signal;

a word line driver controller generating a word line driving control signal in response to the third address decoding signal and a fourth address decoding signal; and a word line driver driving the selected word line to the high voltage in response to the word line driving control signal and a fifth address decoding signal.

14. The semiconductor memory device according to claim 12, further comprising a stand-by high voltage generator connected to an output node of the high voltage generator.

15. The semiconductor memory device according to claim 14, wherein the stand-by high voltage generator generates a same voltage level as the high voltage in stand-by operation.

16. A method for controlling a high voltage generator of a semiconductor memory device having a plurality of refresh type memory cells connected to intersections of a plurality of word lines and a plurality of bit lines, and performing a static random access memory operating interface, comprising the steps of:

generating a command output signal in response to an external command signal applied in a memory cell access operation period;

supplying a high voltage to an internal circuit by enabling the high voltage generator during generation of the command output signal, and delaying the command output signal; and providing the delayed command output signal to the internal circuit for selecting a word line among the plurality of word lines, wherein the selected word line is activated at a point of time that is delayed compared with a supply point of time of the high voltage.

17. The method according to claim 16, wherein the delayed command output signal is applied to an address selection decoder, and the address selection decoder generates a first address decoding signal.

18. The method according to claim 17, wherein the internal circuit includes a word line enable circuit, a word line driver controller, and a word line.

19. The method according to claim 18, wherein the word line enable circuit generates a third address decoding signal at a high voltage level in response to the first address decoding signal and a second address decoding signal.

20. The method according to claim 16, wherein a starting point of time of a supply operation of the high voltage occurs prior to a starting point of time of a charge consumption operation in the internal circuit.

21. The method according to claim 20, wherein the charge consumption operation occurs in the internal circuit after supplying of the high voltage, but before enabling of the selected word line.

* * * * *